United States Patent
Ma et al.

(10) Patent No.: US 9,130,195 B2
(45) Date of Patent: Sep. 8, 2015

(54) STRUCTURE TO ENHANCE LIGHT EXTRACTION AND LIFETIME OF OLED DEVICES

(71) Applicant: Universal Display Corporation, Ewing, NJ (US)

(72) Inventors: Ruiqing Ma, Morristown, NJ (US); Gregory McGraw, Yardley, PA (US); William E. Quinn, Whitehouse Station, NJ (US); Siddharth Harikrishna Mohan, Plainsboro, NJ (US)

(73) Assignee: UNIVERSAL DISPLAY CORPORATION, Ewing, NJ (US)

(*) Notice: Subject to any disclaimer, the term of this patent is extended or adjusted under 35 U.S.C. 154(b) by 0 days.

(21) Appl. No.: 14/087,940

(22) Filed: Nov. 22, 2013

(65) Prior Publication Data

US 2015/0144890 A1    May 28, 2015

(51) Int. Cl.
*H01L 35/24* (2006.01)
*H01L 51/52* (2006.01)

(52) U.S. Cl.
CPC .................. *H01L 51/5275* (2013.01)

(58) Field of Classification Search
CPC ......... H01L 33/50; H01L 33/58; H01L 33/60; H01L 51/5271; H01L 51/5268; H01L 51/0096; H01L 51/56; H01L 22/12; H01L 29/7875; H01L 29/7878; H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254; Y10S 977/742
USPC ......... 257/12–13, 40, 81, 84, 87–89, 98–100, 257/347–348, 433–434; 311/112, 501, 503, 311/506–507
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |

(Continued)

FOREIGN PATENT DOCUMENTS

| | | |
|---|---|---|
| EP | 1238981 | 9/2002 |
| JP | 2010-135467 | 6/2010 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Dung Le
(74) *Attorney, Agent, or Firm* — Morris & Kamlay LLP

(57) ABSTRACT

A device having high index layers is provided. The device includes an organic light emissive device, an air interface, a first planarization layer, and a first barrier layer. The first planarization layer is disposed between the air interface and the organic light emissive device and has an index of refraction of at least 1.6. The first barrier layer is disposed between the first planarization layer and the organic emissive device and has an index of refraction of at least 1.6.

22 Claims, 12 Drawing Sheets

(56) References Cited

U.S. PATENT DOCUMENTS

| | | |
|---|---|---|
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 7,279,704 B2 | 10/2007 | Walters et al. |
| 7,431,968 B1 | 10/2008 | Shtein et al. |
| 7,968,146 B2 | 6/2011 | Wanger et al. |
| 2003/0230980 A1 | 12/2003 | Forrest et al. |
| 2004/0174116 A1 | 9/2004 | Lu et al. |
| 2007/0257608 A1* | 11/2007 | Tyan et al. ............ 313/506 |
| 2008/0278067 A1* | 11/2008 | Tyan et al. ............ 313/504 |
| 2013/0001578 A1* | 1/2013 | Song et al. ............ 257/71 |
| 2013/0026452 A1 | 1/2013 | Kottas et al. |
| 2013/0119354 A1 | 5/2013 | Ma et al. |
| 2014/0070187 A1* | 3/2014 | Cho et al. ............ 257/40 |
| 2014/0103314 A1* | 4/2014 | Satoh et al. ............ 257/40 |

FOREIGN PATENT DOCUMENTS

| | | |
|---|---|---|
| WO | WO 2004/111066 | 12/2004 |
| WO | WO 2008/044723 | 4/2008 |
| WO | WO 2008/057394 | 5/2008 |
| WO | WO 2010/011390 | 1/2010 |
| WO | WO 2010/111175 | 9/2010 |

OTHER PUBLICATIONS

Baldo et al., "Very high-efficiency green organic light-emitting devices based on electrophosphorescence," Appl. Phys. Lett., vol. 75, No. 1, 4-6 (1999).

U.S. Appl. No. 14/042,194.

* cited by examiner

STRUCTURE TO ENHANCE LIGHT EXTRACTION AND LIFETIME OF OLED DEVICES

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present application is related to high index layers for OLED light devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OILED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

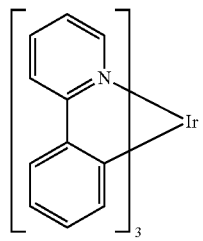

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic, material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is Closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO: energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first Work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OP THE INVENTION

A device including an organic light emitting device, an air interface, a first barrier layer, and second barrier layer is provided. The organic light emitting device includes a first electrode, a second electrode, and a light emitting layer. The light emitting layer is disposed between the first and second electrodes. The first planarization layer is disposed between the air interface and the organic light emitting device. The first planarization layer has an index of refraction of at least 1.6. The first barrier layer is disposed between the first planarization layer and the organic light emitting device. The first barrier layer has an index of refraction of at least 1.6.

In some embodiments the device includes a substrate having a first surface and a second surface. In some embodiments the first planarization layer is disposed over the first surface of the substrate. In some embodiments the first barrier layer is disposed over the first planarization layer. In some embodiments the organic light emitting device is disposed over the first barrier layer.

In some embodiments the first planarization layer has an index of refraction of at least 1.7. In some embodiments the first barrier layer has an index of refraction of at least 1.7.

In some embodiments the first planarization layer is in physical contact with the substrate. In some embodiments the first barrier layer is in physical contact with the first planarization layer.

In some embodiments the device includes a light extraction layer disposed between the organic light emitting device and the air interface. In some embodiments the light extraction layer is disposed between the first surface of the substrate and the organic light emitting device. In some embodiments the light extraction layer is disposed between the first surface of the substrate and the first planarization layer. In some embodiments the light extraction layer is disposed over the second surface of the substrate. In some embodiments the first planarization layer is in physical contact with the light extraction layer. In some embodiments the light extraction layer is in physical contact with the substrate.

In some embodiments the light extraction layer includes a surface with topographical features. In some embodiments the topographical features include at least one of microgrooves, microlenses, and diffractive gratings.

In some embodiments the device includes at least one layer disposed between the first planarization layer and the air interface. In some embodiments the refractive index of the at least one layer disposed between the first planarization layer and the air interface is not greater than the refractive index of the first planarization layer.

In some embodiments every interface between the organic light emitting device and the air interface is defined by a first layer and second layer, the first layer being closer to the organic light emitting device than the second layer. In some embodiments the second layer has a refractive index not greater than the refractive index of the first layer. In some embodiments the second layer has a refractive index not more than 0.05 greater than the refractive index of the first layer. In some embodiments the second layer has a refractive index not more than 0.1 greater than the refractive index of the first layer.

In some embodiments every layer disposed between the organic light emitting device and the air interface has an index of refraction of at least 1.6. In some embodiments every layer disposed between the organic light emitting device and the air interface has an index of refraction of at least 1.7.

In some embodiments the second surface of the substrate has a plurality of topographical features. In some embodiments the topographical features are microlenses.

In some embodiments the indices of refraction of the first planarization layer and the first barrier layer are higher than the index of refraction of the substrate.

In some embodiments a second planarization layer is disposed over the first barrier layer and in between the first barrier layer and the organic light emitting device. In some embodiments a second barrier layer is disposed over the second planarization layer and in between the second planarization layer and the organic light emitting device.

In some embodiments the substrate is made of a flexible material. In some embodiments the flexible material is selected from the group including: polyethylene naphthalate (PEN), polyethylene terephthalate (PET), polyimide, polycarbonate (PC), polyether sulfone (PES), high index polymer materials, metal foils, thin flexible glass organic-inorganic composite materials.

In some embodiments the thickness of the first barrier layer is approximately 5 to 1000 nm.

In some embodiments the first planarization layer is selected from the group including: high index polymer materials, composite materials with dispersed high index nanoparticles, solution processable inorganic materials.

In some embodiments the device includes a light extraction layer disposed over the organic light emitting device and between the first planarization layer and the air interface.

In some embodiments, the index of refraction of the first planarization layer is less than the index of refraction of the first barrier layer and greater than the index of refraction of the substrate.

BRIEF DESCRIPTION OF THE DRAWINGS

The accompanying drawings, which are incorporated herein and form a part of the specification, illustrate embodiments of the present invention and, together with the description, further serve to explain the principles of the invention and to enable a person skilled in the pertinent art to make and use the invention.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett, vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
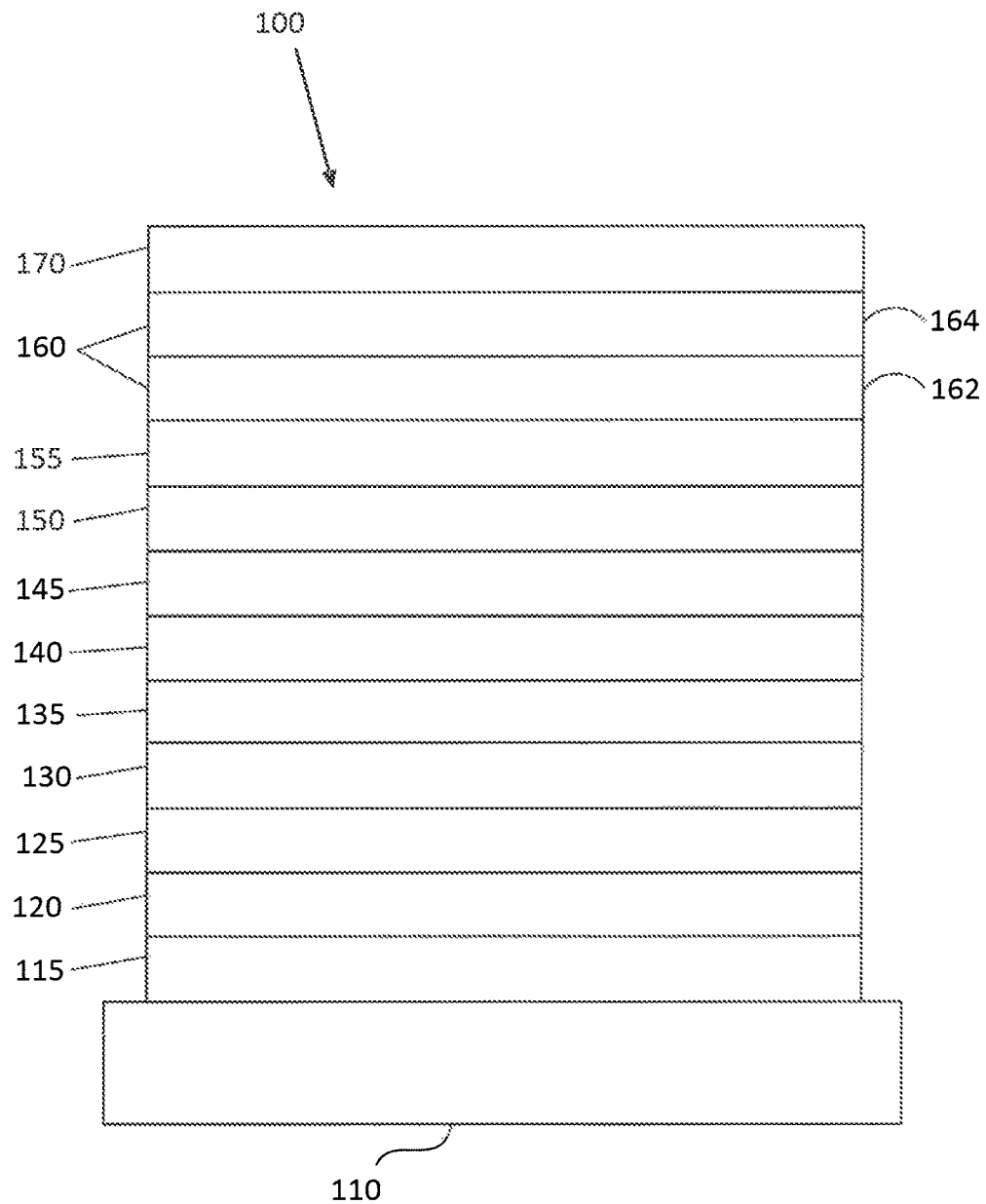
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125; an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols, 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 20030230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 20030230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 20030230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
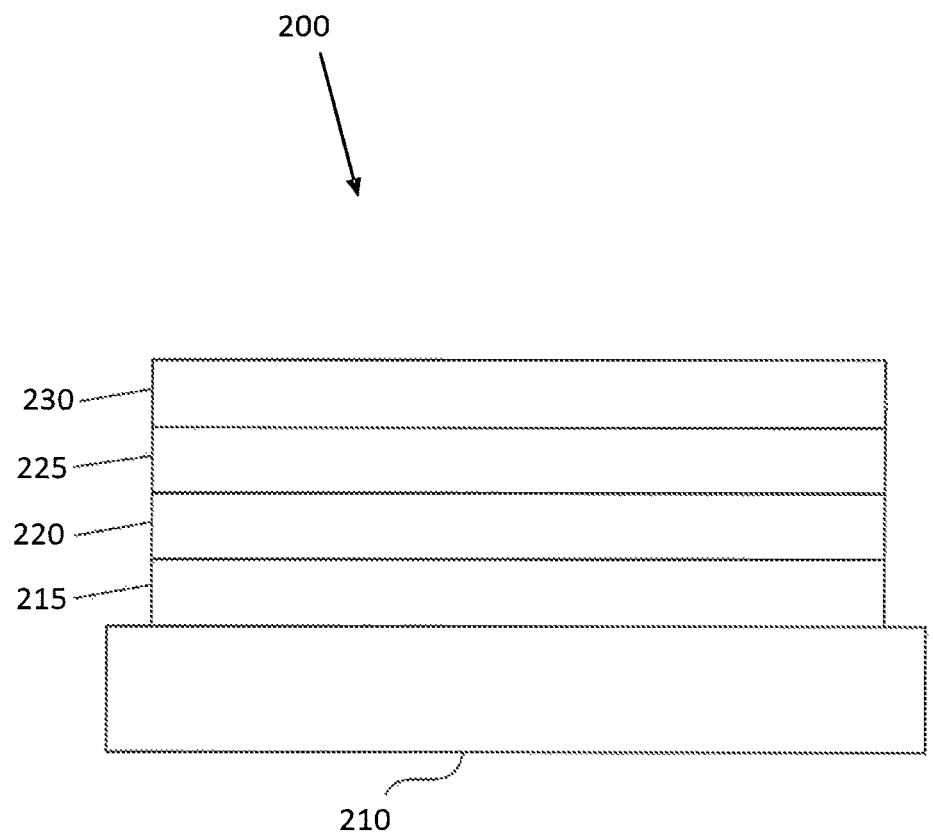
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007023098 and PCT/US2009042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of described herein may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays. 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference.

In this application, we disclose a structure to be placed in the optical path between OLED and the light extraction structure to enhance the light extraction and lifetime of the device. The structure includes at least a high index (>1.6) planarization layer and a high index (>1.6) barrier layer. The structure is placed in the optical path between the OILED device and a light extraction structure and the high index barrier layer is closer to the OLED device than the high index planarization layer.

In a typical OLED device built on glass substrate, there are three types of the refractive indices: 1) high index (1.7~2.0)—these include organic materials and transparent conductive oxide such as ITO; 2) low index (~1.5)—typical glass falls into this category; and 3) air with an index of ~1.0. Every time light travels from high index material ($n_{high}$) to lower index material ($n_{low}$), total internal reflection (TIR) can occur if the following condition is met:

$$\theta_{inc} >= \theta_c = \sin^{-1}(n_{low}/n_{high}),$$

where $\theta_{inc}$ and $\theta_c$ are the incident angle and critical angle, respectively. This portion of light is trapped in the higher index material, and form waveguided light. Since there are two such interfaces in OLED devices, two types of waveguided light exist: organic/anode (or just organic) mode and substrate mode. Since the waveguided light does not emit into the air, this part of light is lost resulting lower efficiency of the OLED device.

Over the years, various techniques have been developed to extract waveguided light. To extract organic mode waveguided light, an internal light extraction layer (TEL) can be place between OLED and substrate. Generally speaking, two types of structure can be used: 1) scattering layer; and 2) topographical features. Two examples of topographical features are micron size micro-grooves and diffractive gratings. When the topographical feature size is larger than the wavelength of the light, the light propagation can be disrupted through refraction. When the feature size is comparable to the wavelength of the light, diffraction occurs which can also change the light prorogation direction. A scattering layer is a composite structure having a matrix material with particles, i.e. microparticles or nanoparticles, dispersed within the matrix. When a scattering layer is disposed over another layer, the matrix material will generally have an index of refraction approximately equal to the index of refraction of that layer. The particles will have an index of refraction that is higher or lower than the matrix material. Light traveling through the matrix material will be deflected by the particles thereby causing light scattering. This light scattering reduces the amount of total internal reflection that occurs as the light leaves the scattering layer and thus increases outcoupling efficiency. Light extraction layers can also include a combination of topographical features and scattering particles for scattering light.

Another light extraction technique to eliminate or reduce the organic waveguiding is to increase the refractive index of the substrate material when the refractive index of the substrate is the same as the organic materials, the TIR effect can be eliminated. In this case, light extraction can be realized by introducing an external light extraction layer (EEL) at the high index substrate-air interface. The challenge for this approach is that the selection of high index substrate materials is very limited. Glass with high index is difficult to make and expensive. Also high index glass can't be used to make flexible OLEO: devices. Polymer films, on the other hand, are available with higher index. For example, the indices of PET and PEN films are around 1.6 and 1.7 respectively.

Introducing extra IEL material next to MID generates a new problem. These ILL structures typically contain at least one polymer material and sometimes solvents have to be used during the process. Over time, moisture, solvent, or other chemicals trapped inside the polymer material may be released and can degrade OLED devices. In the high index plastic substrate approach, a permeation barrier layer is needed to protect the °LED from the moisture or gases either released or transmitted through the plastic substrate. However, most permeation barrier structures contain at least one component that has low index. When placed in the optical path, it will reduce or eliminate the effect of extracting the organic mode waveguided light.

The index of the planarization layer and the barrier layer should be at least 1.6. Even higher index (e.g. >1.7) is more preferred. It is preferred that the index of the planarization layer and barrier layer is higher than the substrate materials. Best light extraction can be achieved when the refractive indices of substrate, high index planarization layer, high index barrier layer and organic light emitting materials are similar.

The barrier material can be oxides, nitride or other inorganic or composite materials. Some examples of high index barrier materials include SiN (n~2.02 @550 nm), $Al_2O_3$ (n~1.77 @550 nm), ZnO (n~2.02 @550 nm), $ZrO_2$ (n~2.22 @550 nm). The barrier can be deposited by PECVD, CVD, sputtering, ALD or other thin film deposition techniques. The film thickness can range from a few nanometers to a few microns. Preferably, the barrier layer may be approximately 5 to 1000 nm.

An example of high index planarization materials is the OptiNDEX™ high refractive index coating materials by Brewer Science. Other examples of high index planarization materials include high index polymer materials, composite materials with dispersed high index nano-particles, and solution processable inorganic materials. The high index planarization layer can be deposited by spin-coating, slot die coating or other coating techniques. The thickness of the coating depends on the surface features to be planarized. Typical thickness can range from a few hundred nanometers to a few microns.

The overall planarization and barrier performance can be enhanced by repeating the novel structure. For example, when large surface topographical features are used, more coatings of high index planarization layer can be used. More barrier layers can improve the overall barrier performance.

Embodiments of the high index structure having a high index bather layer and a high index planarization layer can be used with any type of OLED, including bottom emission, top emission, or transparent devices. The high index structure is preferably placed in the optical path between the light transmitting electrode and the light extraction structure.

As used herein the term "air interface" means the boundary where air meets the outermost surface of the device through which light passes on its way to a viewer. For example, in a typical bottom emitting device, light is emitted through the substrate and not through the electrode furthest from the substrate. In this case the air interface is the interface between the air and the substrate. The "air interface" can be a surface of the substrate, or the outermost surface of one or more layers deposited on the substrate on the side opposite of where the OLED is deposited.

Figure 3:
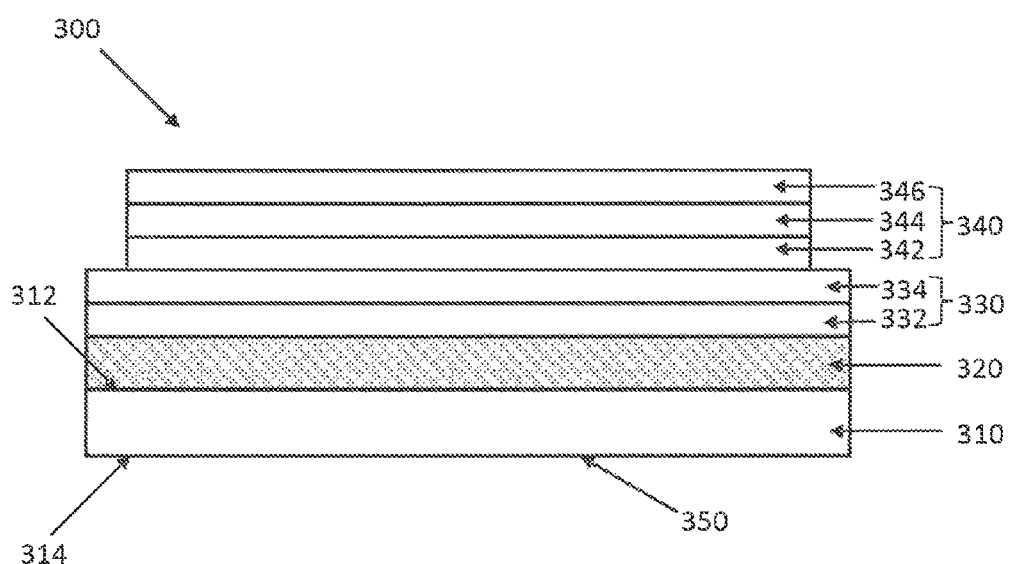
FIG. 3 shows an exemplary device according to one embodiment.

FIG. 3 shows an exemplary device 300. Device 300 includes an internal light extraction layer 320. Internal light extraction layer 320 is built on top of substrate 310. Substrate 310 includes a first surface 312 and a second surface 314. A high index structure 330, including a high index planarization layer 332 and a high index barrier layer 334, is placed on top of internal light extraction layer 320. An OLED 34Q, including a light transmitting first electrode 342, organic material layer 344, and a second electrode 346, is built over high index structure 330. Organic material layer 344 can include multiple layers such as hole/electron injection layers, hole/electron transport layers, emission layers and blocking layers. Light generated in organic material layer 344 will pass through light transmitting first electrode 342, high index structure 330 and substrate 310 and then into the air at air interface 350 located on second surface 314. In some embodiments, as show in FIG. 8, an external light extraction layer (EEL) 324 can be disposed on second surface 314 at air interface 350.

Figure 4:
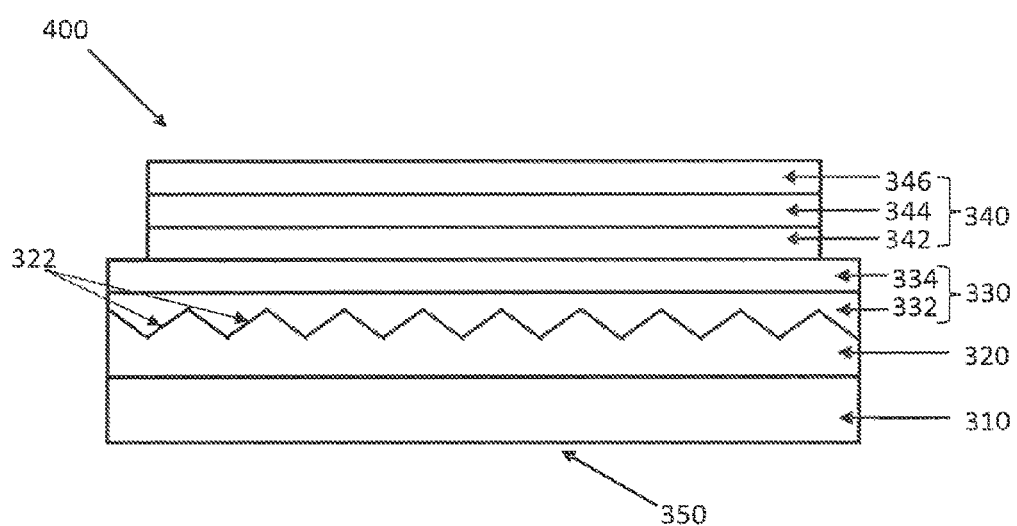
FIG. 4 shows an exemplary device according to one embodiment.

FIG. 4 shows an exemplary device 400. In FIG. 4, internal light extraction layer 320 includes topographical features 522. Topographical features 322 can include, but are not limited to, micro-grooves, microlenses, or diffractive gratings. High index planarization layer 332 planarizes the surface of internal light extraction layer 320 and high index barrier layer 334 protects OLED 340 from any moisture or gases, including vapors emitted from high index barrier layer 334.

In a preferred configuration, a high index structure is provided that includes alternating planarization and barrier layers. Each barrier layer is in physical contact with an underlying planarization layer, and each planarization layer, except the first, is in physical contact with an underlying barrier layer. This structure is preferred for its moisture resistant properties. But, other configurations may be used.

Figure 5:
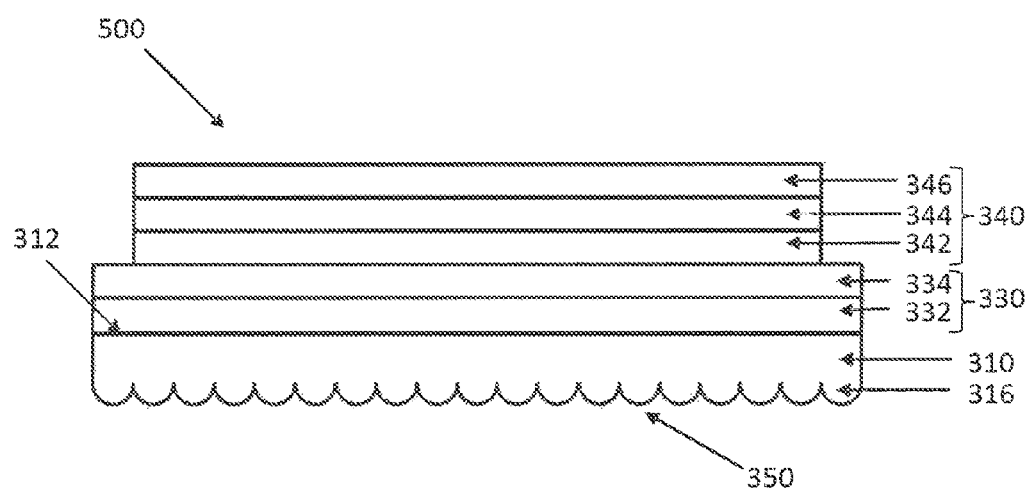
FIG. 5 shows an exemplary device according to one embodiment.

FIG. 5 shows the configuration for an exemplary device 500. Device 500 includes a substrate 310 with a high index, for example, an index between approximately 1.7 and 2.0. In this case, high index structure 330 is deposited over first surface 312 of substrate 310. High index planarization layer 332 is used to generate a smooth surface on a high index substrate, such as a plastic substrate. The surface quality of most plastic films is not good enough for OLED fabrication. Surface protrusions can easily cause the shorting of the OLED devices. High index planarization layer 332 addresses this issue. High index barrier layer 334 is used to protect °LED 340 from moisture and gases, such as $O_2$, or vapors emitted from high index planarization layer 332. Substrate 310 on device 500 also includes topographical features 316 disposed on second surface 314 for improving the transmission of light from substrate into the air at air interlace 350, i.e. improving outcoupling efficiency. Topographical features 316 reduce the amount of total internal reflection that can occur at the air interface 350 and thereby increase outcoupling efficiency.

Outcoupling efficiency can also be improved by reducing the change in refractive index (Δn) between layers within a light emitting device. When light crosses an interface in a device, some of the light may be reflected. There are different types of reflection. One type is "total internal reflection." Total internal reflection can be described in terms of a "critical angle." Light hitting an interface at an angle to normal smaller than the critical angle will pass through the interface, while light hitting an interface at an angle to normal greater than the critical angle will be reflected. Where multiple layers with different refractive indices are involved, generally only the refractive index of the starting material and the refractive index of the final material matter in determining how much light escapes into the final material. Another type of reflection is Fresnel reflection. Fresnel reflection occurs even for light that hits an interface at an angle to normal smaller than the critical angle. Indeed, Fresnel refection occurs for light hitting an interface from a normal direction. The magnitude of Fresnel reflection at an interface for normally incident light is $(n1-n2)^2(n1+n2)^2$. When moving from a high index material to a low index material, total Fresnel reflection may be reduced by using a number of small steps down in the index of refraction, as opposed to a single large step down.

Outcoupling efficiency decreases due to total internal reflection and Fresnel reflection that occurs when light from OLED 340 moves from a first layer having a high index of refraction to a second layer having a lower index of reflection relative to the first layer. This reflection occurs at the interface of the first and second layers where there is a discrete change in refractive index ($\Delta n$). The larger the change in refractive index ($\Delta n$) the larger the amount of reflection that occurs at an interface. And the total amount of Fresnel reflection is less for a number of small steps down in index of refraction than it is for a single large step down, even if the total change in index is the same in both cases. As such, it is preferable to step down the index of refraction slowly, i.e. decrease $\Delta n$ between layers, when moving from OLED 340 towards air interface 350.

Figure 6A:
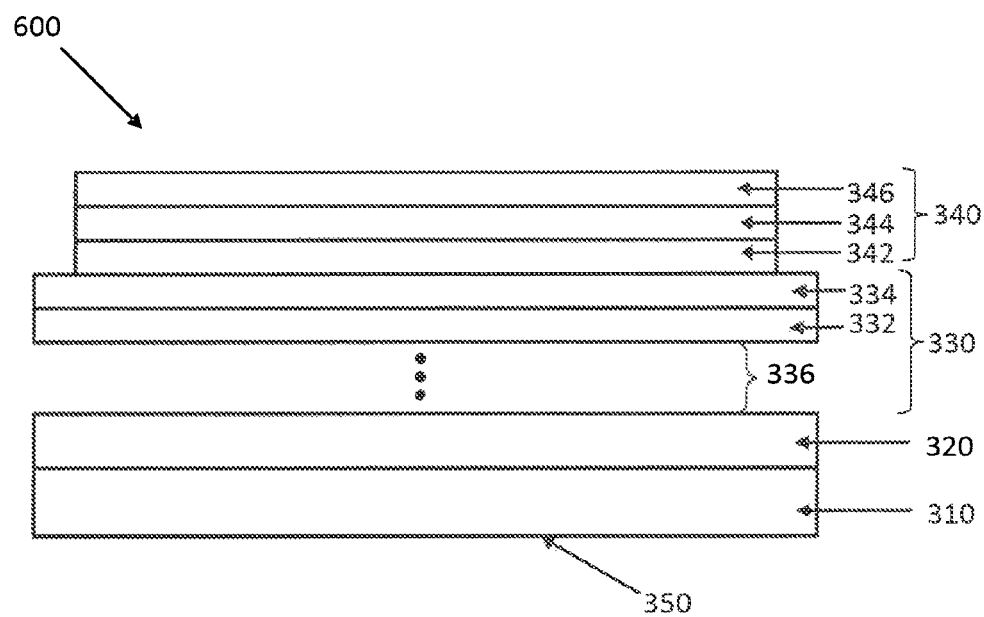
FIGS. 6A and 6B show an exemplary device according to one embodiment.
Figure 6B:
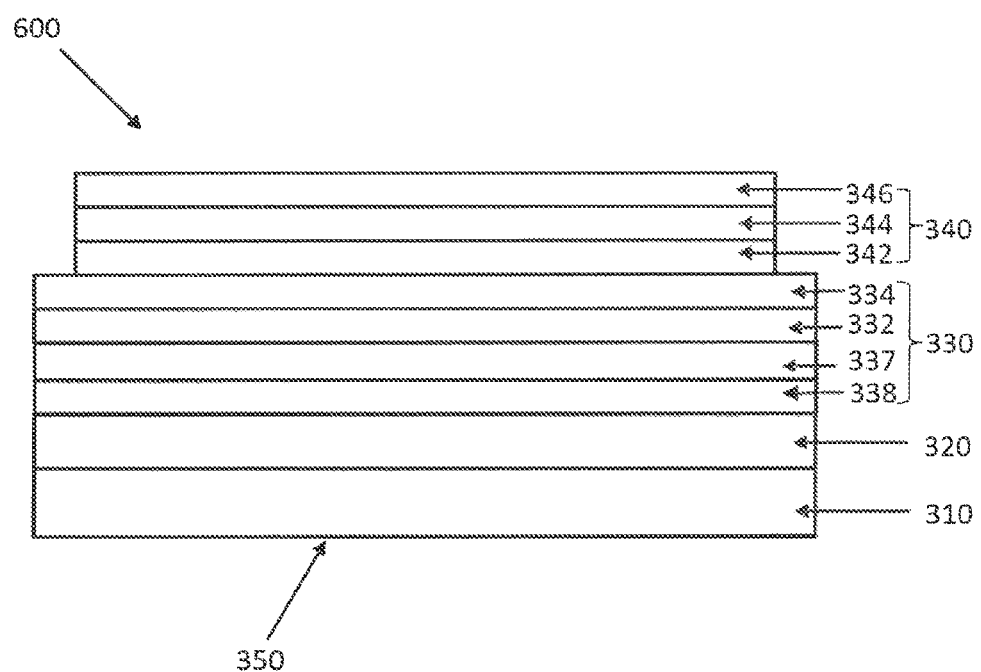

FIGS. 6A and 6B show an exemplary device 600 including at least one optional additional layer 336 for stepping down the index of refraction. Device 600 includes an internal light extraction layer 320 disposed over a substrate 310. Below substrate 310 is air interface 350. The high index structure 330 in device 600 includes high index planarization layer 332 and high index barrier layer 334 along with at least one additional layer 336. Additional layers 336 can include, but are not limited to, barrier layers, planarization layers, light extraction layers, or polarization layers. Disposed over high index structure 330 is OLED 340. It is appreciated that there can be any number of additional layers 336. For example, FIG. 6B shows device 600 having two additional layers 336, a first additional layer 337 and a second additional layer 338.

Additional layers 336 are optionally provided to increase the outcoupling efficiency of device 600 by decreasing total Fresnel reflection at interfaces located between OLED 340 and air interface 350. For example, if internal light extraction layer 320 has a lower index of refraction than planarization layer 332 some reflection will occur at the interface between internal light extraction layer 320 and planarization layer 332. Additional layers 336 may reduce the amount of reflection by slowly stepping down the index of refraction from planarization layer 332 to internal light extraction layer 320. In other words, additional layers 336 may reduce the maximum $\Delta n$ at the interface between any two layers located between OLED 340 and air interface 350.

In reference to FIGS. 6A and 6B and by way of example only, if no additional layers 336 are provided, a large amount of Fresnel reflection may occur at an interface between a planarization layer 332 having an index of refraction equal to 1.7 and an internal light extraction layer 320 having an index of refraction equal to 1.55 ($\Delta n$=0.15). The use of additional layers 336 with smaller changes in index of refraction may help to mitigate this effect. For example, first additional layer 337 and second additional layer 338 in FIG. 6B may have refractive indices of 1.65 and 1.6, respectively. In this situation the largest $\Delta n$ is 0.05. Therefore, the outcoupling efficiency between planarization layer 332 and internal light extraction layer 320 is improved because the maximum $\Delta n$ that light must pass through is reduced from 0.15 to 0.05.

While FIG. 6B shows two additional layers 336. It is appreciated that any number of additional layers can be provided to step down the $\Delta n$ between any interface located between OLED 340 and air interface 350. For example, four additional layers 336 may be provided having indices of refraction equal to 1.67, 1.64, 1.61, and 1.58, respectively. In this situation the maximum $\Delta n$ at each interface is equal to 0.03. Furthermore, it appreciated that no additional layers may be provided, as shown in FIG. 3.

Figure 7A:
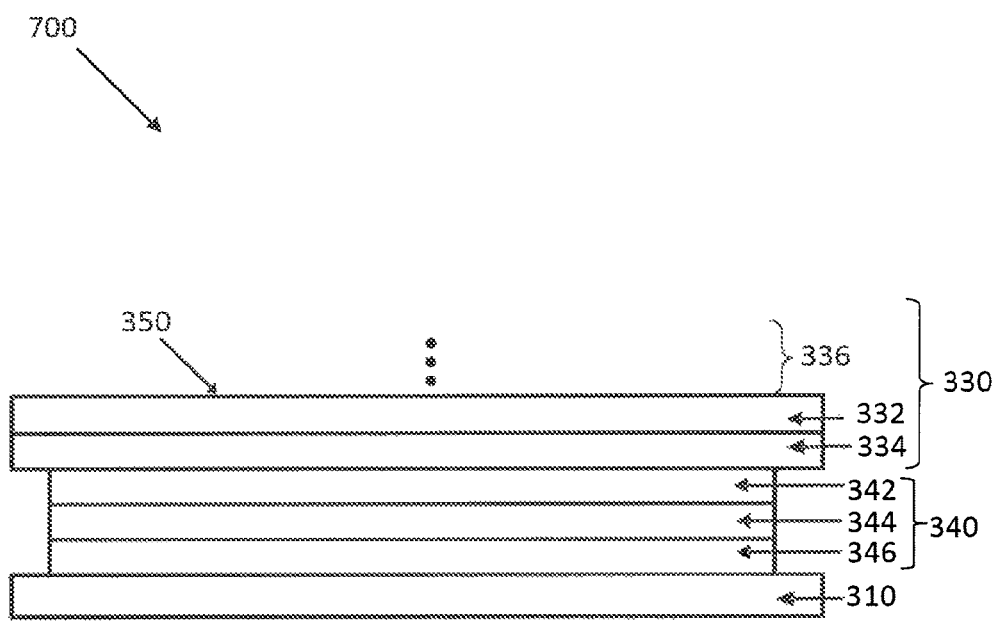
FIGS. 7A and 7B show an exemplary device according to one embodiment.
Figure 7B:
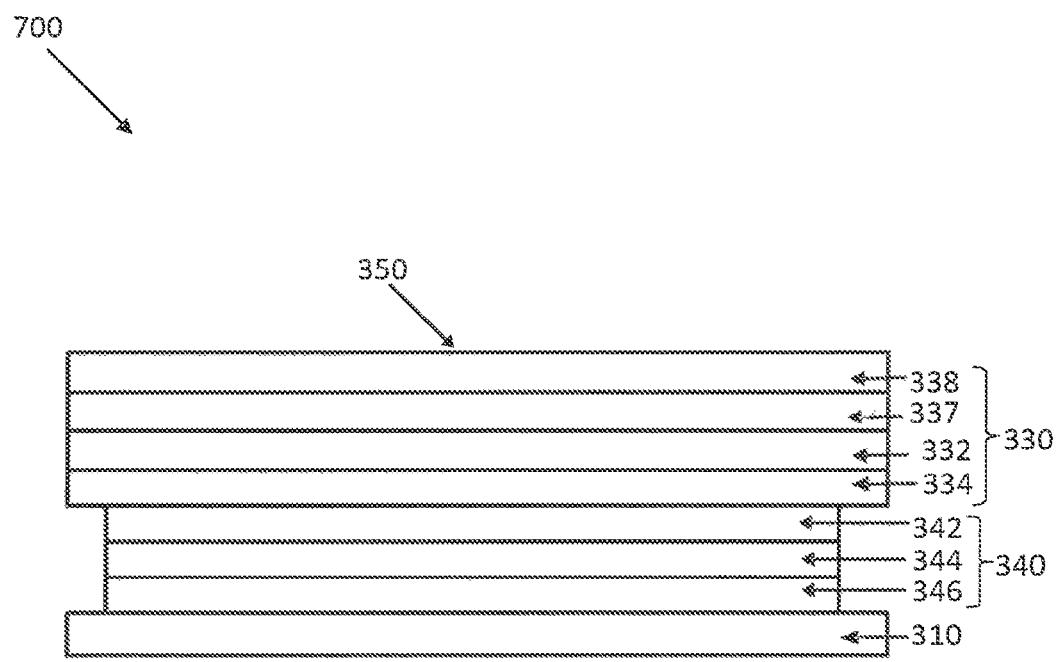

FIGS. 7A and 7B Show an exemplary device 700 including at least one optional additional layer 336. Device 700 includes a high index structure 330 disposed over OLED 340 on top of substrate 310. Similar to FIG. 6A, high index structure 330 can include at least one additional layer 336. Additional layers 336 can include, but are not limited to, barrier layers, planarization layers, light extraction layers, or polarization layers. It is appreciated that there can be any number of additional layers 336. For example, FIG. 7B shows device 700 having two additional layers 336, first additional layer 337 and second additional layer 338.

In reference to FIGS. 7A and 7B and by way of example only, if no additional layers 336 are provided and if planarization layer 332 has an index of refraction equal to 1.6, the $\Delta n$ between planarization layer 332 and air, which has an index of refraction of 1, would be 0.6. Additional layers are optionally provided to reduce the $\Delta n$ between device 700 and air interface 350. For example, as shown in FIG. 7B, first additional layer 337 and second additional layer 338 may be provided. In this example, first additional layer 337 may have an index of refraction equal to 1.5 and second additional layer 338 may have an index of refraction equal to 1.4. This results in a maximum $\Delta n$ of 0.4 instead of 0.6 at air interface 350, thereby increasing the outcoupling efficiency of device 700.

While FIG. 7B shows two additional layers 336. It is appreciated that any number of additional layers can be provided to step down the $\Delta n$ between any interface located between OLED 340 and air interface 350. For example, four additional layers 336 may be provided with indices of refraction equal to 1.55, 1.5, 1.45, and 1.4. In this situation the maximum $\Delta n$ is also equal to 0.4, but the $\Delta n$ at the interfaces between the additional layers is reduced from 0.1 to 0.05, thereby increasing outcoupling efficiency. Furthermore, it appreciated that no additional layers may be provided.

Preferably the index of refraction of a second layer located further away from OLED 340 is never greater than the index of refraction of a first layer located closer to OLED 340. In other words, it is preferable that the index of refraction always decreases when moving from OLED 340 to air interface 350. When light crosses an interface and moves from a higher index material to a lower index material, some light may be reflected. Because light from an OLED eventually passes from the organic materials of an OLED, which typically have refractive indices of about 1.6 to 1.7, to air, which has a refractive index of about 1, the light needs to cross interfaces where the index of refraction decreases.

There is no total internal reflection when light crosses an interface from a lower index material to a higher index material. But once the light is in the higher refractive index material, the difficulty of extracting the light into air, with its refractive index of 1, is greater. The total decrease in index of refraction that the light needs to navigate before reaching air is increased, which increases opportunities for undesirable reflection.

But there are situations where it may be desirable to provide a second layer having other properties that outweigh the second layer undesirably having a higher index of refraction than a first layer, i.e. an increase in refractive index at the interface between the first layer and the second layer as light moves towards an air interface. The second layer may have superior structural properties or moisture resistance properties or may be cheap and easy to manufacture. Preferably, any increase in index of refraction is small. Preferably, this increase is not greater than 0.1, most preferably this increase is not greater than 0.05.

Figure 8:
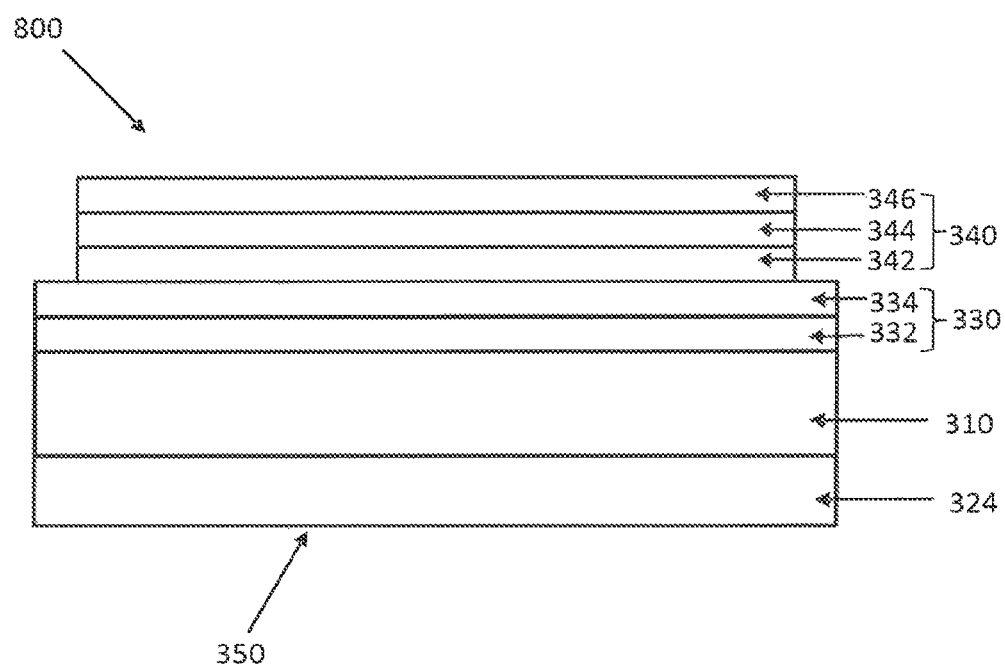
FIG. 8 shows an exemplary device according to one embodiment.

FIG. 8 shows an exemplary device 800 including external light extraction layer 324. Device 800 includes substrate 310, high index structure 330, and ° LED 340. External light extraction layer 324 is disposed over second surface 314 of substrate 310 between substrate 310 and air interface 350. While not shown in FIG. 8, it is appreciated that device 800 could include any number of additional layers 336 as described above in reference to FIGS. 6A-B and 7A-B.

Figure 9A:
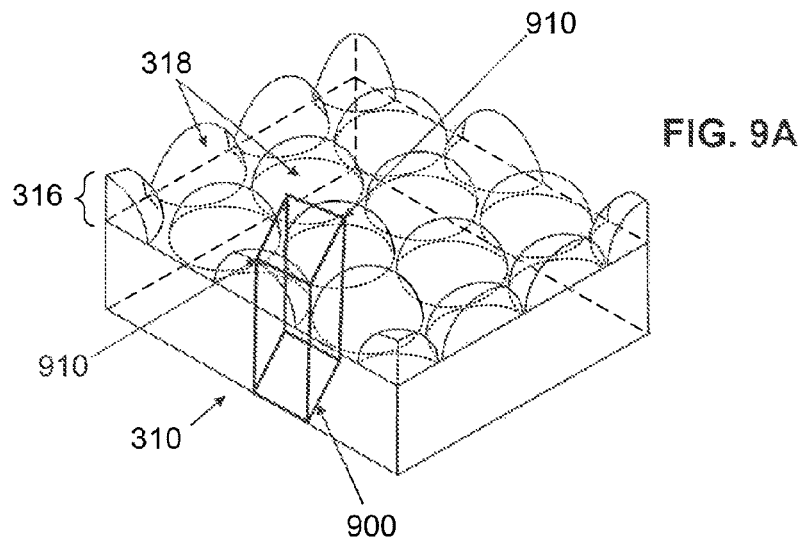
FIGS. 9A and 9B illustrate a cell used to model the outcoupling efficiency of light according to one embodiment.
Figure 9B:
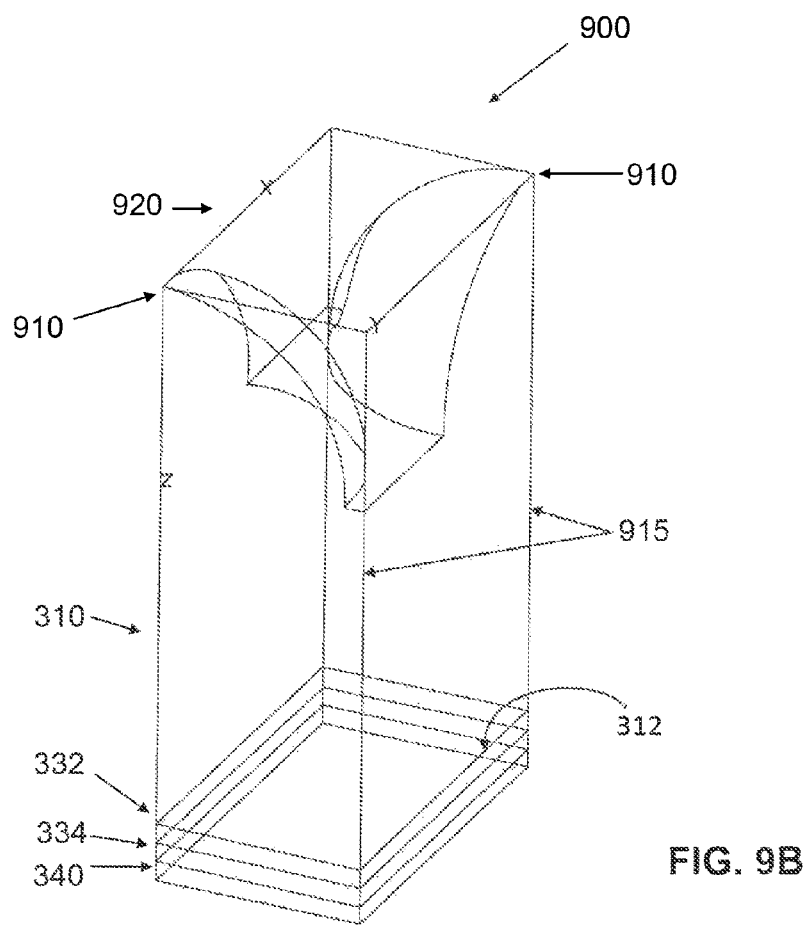

Modeling:

FIGS. 9A and 9B model the effect of the index of refraction of planarization layer 332 on a structure similar to FIG. 5. This effect was evaluated with an optical ray tracing model. This model considers only the geometry, refractive index, and reflectivity of the modeled components. Wavelength dependent effects such as thin film interference are absent. Substrate 310 having topographical features 316 containing a hexagonal array of index matched microlenses 318 was modeled using a rectangular prism cell 900 to represent a reflection symmetric unit of surface area. Cell 900 is shown in expanded view in FIG. 9B. Cell 900 extends from OLED 340 to the top of substrate 310 with index matched microlenses 318. Vertical walls 915 are perfectly reflective and serve as symmetry boundary conditions. Cell 900 consists of a 100 unit thick substrate 310 with a refractive index of n=1.7. It is topped by quarter sections of two index matched, 50 unit high hemispherical microlenses 318 centered at opposite corners 910. The space around microlenses 318 is assumed to be filled with air, n=1.0. The transparent top boundary 920 of cell 900 intersects two microlenses at their apexes at corners 910. Barrier layer 334 and planarization layer 332 are disposed over first surface 312 of substrate 310. Planarization layer 332 has variable index of refraction $n_p$. Barrier layer 334 has an index of refraction of 1.9. Both planarization layer 332 and barrier layer 334 are 5 units thick.

Light enters the modeled structure along the plane of intersection between barrier layer 334 and OLED 340. Light rays originate with positions stochastically chosen to represent a spatially uniform light source with trajectories chosen to represent a Lambertian distribution of light intensity. Ten thousand rays were simulated. The light emitting surface of OLED 340 also acts as an 80% reflective mirror for incident light to simulate the effect of a metal cathode. Simulations were performed using TraceProg® 3.3 from Lambda Research (Littleton, Mass.).

Figure 10:
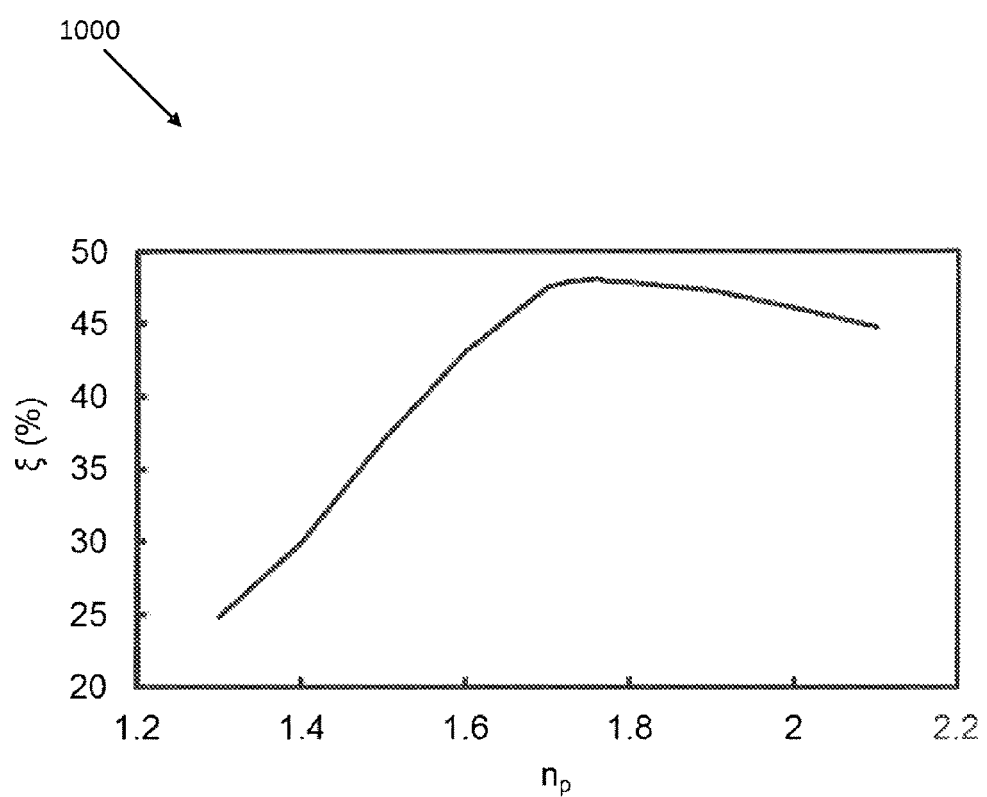
FIG. 10 shows a graph of percent outcoupling efficiency ($\xi$) versus index of refraction of the planarization layer ($n_p$) modeled based on the cell in FIGS. 9A and 9B.

The dependence of outcoupling efficiency on $n_p$ is plotted in FIG. 10. The vertical axis of graph 1000 shows ξ percentage of light entering the substrate that crosses transparent top boundary 920. In this example, optimal light outcoupling is at $n_p$=1.76, with ξ=48.2%. Generally, the best performance is achieved when $n_p$ has a value between the refractive indices substrate 310 and high index barrier layer 334. In such cases, planarization layer 332 is able to accept all light rays from barrier layer 334 that can propagate through substrate 310. In this case, no additional light is lost to total internal reflection due to the presence of planarization layer 332. Planarization layer 332 also acts as a Fresnel anti-reflective layer at the boundary between barrier layer 334 and substrate 310. It reduces the partial reflection of light rays by permitting a more gradual index of refraction change.

Conversely, if $n_p$ is lower than the index of refraction of substrate 310, some light that could propagate through substrate 310 will be unable to cross through planarization layer 332. This light is lost to total internal reflection at the interface between barrier layer 334 and planarization layer 332. Using a planarization layer of lower index than the substrate negates the advantage of the high index substrate. For example, the outcoupling efficiency (ξ) for a planarization layer with an $n_p$=0.1.5 and substrate with an index of refraction equal to 1.7 and with index matched microlenses is 37.1%. In contrast, a substrate of the same architecture with n=1.5 yields ξ=40.3%.

Total internal reflection can be mitigated and anti-reflective properties can be improved by using thin low index films chosen to take advantage of wavelength scale effects in light. Such films must be ¼ a wavelength in thickness or less. A coating with $n_p$=0.5 has best anti-reflective properties if it is 80 nm thick. Likewise, such a coating would have to be 30 nm thick or less to transmit a substantial amount of light that would otherwise be lost to total internal reflection. These films are too thin to serve as effective planarization layers. Therefore, it is necessary for a planarization layer to have high refractive index in order for an OLED structure to outcouple light efficiently.

What is claimed is:

1. A device comprising:
   an organic light emlitting device having a first electrode, a second electrode, and a light emitting layer disposed between the first and second electrodes;
   an air interface;
   a first planarization layer disposed between the air interface and the organic light emitting device, the first planarization layer having an index of refraction of at least 1.6; and
   a first barrier layer disposed between the first planarization layer and the organic light emitting device, the first barrier layer having an index of refraction of at least 1.6;
   wherein the first planarization layer planarizes a non-planar surface of a layer of the device.

2. The device of claim 1, wherein the device further comprises:
   a substrate having a first surface and a second surface;
   wherein:
      the first planarization layer is disposed over the first surface of the substrate;
      the first barrier layer is disposed over the first planarization layer; and
      the organic light emitting device is disposed over the first barrier layer.

3. The device of claim 1, wherein the first planarization layer has an index of refraction of at least 1.7.

4. The device of claim 1, wherein the first barrier layer has an index of refraction of at least 1. 7.

5. The device of claim 2, wherein the first planarization layer is in physical contact with the substrate.

6. The device of claim 2, wherein the first barrier layer is in physical contact with the first planarization layer.

7. The device of claim 2, further comprising a light extraction layer disposed between the organic light emitting device and the air interface.

8. The device of claim 7, wherein the light extraction layer is disposed between the first surface of the substrate and the first planarization layer.

9. The device of claim 7, wherein the light extraction layer is disposed over the second surface of the substrate.

10. The device of claim 7, wherein the light extraction layer comprises a surface with topographical features.

11. The device of claim 1, further comprising at least one layer disposed between the first planarization layer and the air interface.

12. The device of claim 11, wherein the refractive index of the at least one layer disposed between the first planarization layer and the air interface is not greater than the refractive index of the first planarization layer.

13. The device of claim 1, wherein for every interface between the organic light emitting device and the air interface, the interface is defined by a first layer and a second layer, the first layer is closer to the organic light emitting device than the second layer, and the second layer has a refractive index not greater than the refractive index of the first layer.

14. The device of claim 1, wherein for every interface between the organic light emitting device and the air interface, the interface is defined by a first layer and a second layer, the first layer is closer to the organic light emitting device than the second layer, and the second layer has a refractive index not more than 0.05 greater than the refractive index of the first layer.

15. The device of claim 1, wherein for every interface between the organic light emitting device and the air interface, the interface is defined by a first layer and a second layer, the first layer is closer to the organic light emitting device than the second layer, and the second layer has a refractive index not more than 0.1 greater than the refractive index of the first layer.

16. The device of claim of claim 2, wherein the second surface of the substrate has a plurality of topographical features.

17. The device of claim 1, wherein the indices of refraction of the first planarization layer and the first barrier layer are higher than the index of refraction of the substrate.

18. The device of claim 2, further comprising a second planarization layer disposed over the first barrier layer, wherein the second planarization layer is disposed between the first barrier layer and the organic light emitting device.

19. The device of claim 18, further comprising a second barrier layer disposed over the second planarization layer, wherein the second barrier layer is disposed between the second planarization layer and the organic light emitting device.

20. The device of claim 1, wherein the substrate comprises a flexible material.

21. The device of claim 2, wherein the index of refraction of the first planarization layer is less than the index of refraction of the first barrier layer and greater than the index of refraction of the substrate.

22. The device of claim 2, wherein the first surface of the substrate has a plurality of topographical features, and the planarization layer planarizes the first surface of the substrate.

* * * * *